(12) United States Patent
Dakshina-Murthy et al.

(10) Patent No.: US 7,709,373 B1
(45) Date of Patent: May 4, 2010

(54) SYSTEM AND METHOD FOR IMPRINT LITHOGRAPHY TO FACILITATE DUAL DAMASCENE INTEGRATION IN A SINGLE IMPRINT ACT

(75) Inventors: Srikanteswara Dakshina-Murthy, Wappingers Falls, NY (US); Bhanwar Singh, Morgan Hill, CA (US); Khoi A Phan, San Jose, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 652 days.

(21) Appl. No.: 11/553,220

(22) Filed: Oct. 26, 2006

Related U.S. Application Data

(62) Division of application No. 10/874,500, filed on Jun. 23, 2004, now Pat. No. 7,148,142.

(51) Int. Cl.
*H01L 21/4763* (2006.01)
(52) U.S. Cl. .................. 438/637; 438/674; 438/597
(58) Field of Classification Search .......... 438/674, 438/678, 669, 637, 597, 622; 430/320, 323, 430/322
See application file for complete search history.

(56) References Cited

U.S. PATENT DOCUMENTS

| | | | |
|---|---|---|---|
| 6,080,529 A | 6/2000 | Ye et al. | |
| 6,174,801 B1 | 1/2001 | Tzu et al. | |
| 6,753,250 B1 | 6/2004 | Hill et al. | |
| 6,768,324 B1 | 7/2004 | Yamada et al. | |
| 7,235,474 B1 * | 6/2007 | Dakshina-Murthy et al. | 438/597 |
| 2005/0202350 A1 | 9/2005 | Colburn et al. | |

\* cited by examiner

*Primary Examiner*—Thinh T Nguyen
(74) *Attorney, Agent, or Firm*—Turocy & Watson, LLP

(57) ABSTRACT

A system and method are provided to facilitate dual damascene interconnect integration in a single imprint step. The method provides for creation of a translucent imprint mold with three-dimensional features comprising the dual damascene pattern to be imprinted. The imprint mold is brought into contact with a photopolymerizable organosilicon imaging layer deposited upon a transfer layer which is spin coated or otherwise deposited upon a dielectric layer of a substrate. When the photopolymerizable layer is exposed to a source of illumination, it cures with a structure matching the dual damascene pattern of the imprint mold. A halogen breakthrough etch followed by oxygen transfer etch transfer the vias from the imaging layer into the transfer layer. A second halogen breakthrough etch followed by a second oxygen transfer etch transfer the trenches from the imaging layer into the transfer layer. A dielectric etch transfers the pattern from the transfer layer into the dielectric layer. A metal fill process then fills the dual damascene openings of the dielectric layer with metal.

20 Claims, 15 Drawing Sheets

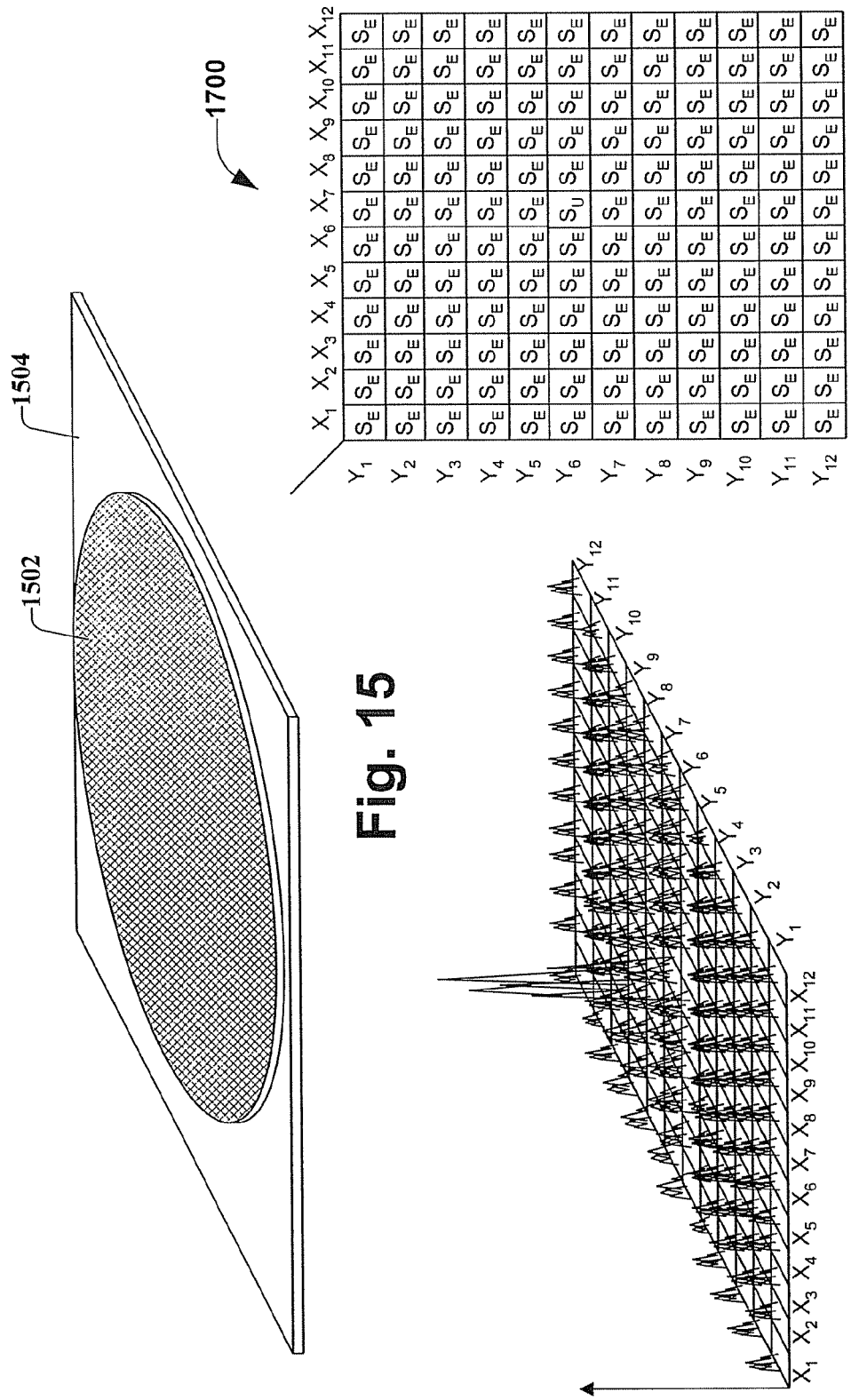

SYSTEM AND METHOD FOR IMPRINT LITHOGRAPHY TO FACILITATE DUAL DAMASCENE INTEGRATION IN A SINGLE IMPRINT ACT

RELATED APPLICATION

This application is a division of application Ser. No. 10/874,500 filed on Jun. 23, 2004 now U.S. Pat. No. 7,148,142, which is hereby incorporated by reference.

FIELD OF THE INVENTION

The present invention generally relates to semiconductor processing and, more particularly, to systems and methods for imprint lithography that facilitate dual damascene interconnect integration in a single imprint step.

BACKGROUND OF THE INVENTION

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller feature sizes are required. This includes the width and spacing of interconnecting lines, spacing and diameter of contact holes, and the surface geometry, such as corners and edges, of various features. The dimensions of and between such small features can be referred to as critical dimensions. With an ever increasing number of integrated circuit features being formed on a circuit die, the importance of properly designing patterns to form structures that are isolated and non-interfering with one another has also increased.

The requirement of small features with close spacing between adjacent features requires high resolution lithographic processes. In general, lithography refers to processes for pattern transfer between various media. It is a technique used for integrated circuit fabrication in which a silicon structure is coated uniformly with a radiation-sensitive film (the resist or lithographic coating) and an exposing source (such as optical light, x-rays, or an electron beam) illuminates selected areas of the surface through an intervening master template. The intervening master template is generally known as a mask, photomask, or reticle for a particular pattern. The lithographic coating is generally a radiation-sensitive coating suitable for receiving a projected image of the subject pattern. Once the image is projected, it is indelibly formed in the coating. The projected image may be either a negative image or a positive image of the subject pattern. Exposure of the coating through a reticle, mask or photomask causes the image area to become either more or less soluble (depending on the coating) in a particular solvent developer. The more soluble areas are removed in the developing process to leave the pattern image in the coating as less soluble polymer.

The process of manufacturing semiconductors (e.g., integrated circuits, ICs, chips) employing masks typically consists of more than a hundred steps, during which hundreds of copies of an integrated circuit may be formed on a single wafer. Generally, the process involves creating several patterned layers on and into the substrate that ultimately fowls the complete integrated circuit. The patterned layers are created, in part, by the light that passes through the masks. A series of lenses provides for reduction in size from the mask to the projected image onto the resist. The optical equipment for traditional photolithographic processes requires significant capital investment.

Imprint lithography (also know as nanoprint lithography, nanoprint, nanoimprint or nanoimprint lithography) technologies are emerging which provide an alternative in which the capital investment is significantly reduced in part because patterns are exposed through a 1:1 mask or mold in close proximity to the wafer. Imprint lithography is relatively inexpensive because it avoids costly optics, as well as cumbersome enhancement techniques like phase-shift masks. Capital cost for equipment is far less than typical step-and-scan or scan and repeat systems. Imprint lithography does not depend on costly optical elements; rather, the line width is determined by the mask or mold.

One advantage of imprint lithography is that the circuit designers do not need to be concerned about optical proximity correction which limits how patterns are placed on the mask. Furthermore, patterning on top of a grating or other surfaces with severe topological features is possible providing significant advantages in MEMS applications.

Because imprint lithographic methods do not utilize the typical 4x optical reduction employed in conventional lithographic processes, however, the small feature sizes are more difficult to achieve. In order to produce devices with similar critical dimensions to conventional optical lithographic methods, new processes and techniques are required. Techniques which reduce the number of steps required to produce three dimensional features can further extend the economic advantages of imprint lithography.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

Systems and methods for imprint lithography are provided that facilitate the integration of dual damascene interconnect features in one imprint step. The present invention facilitates reproduction of features required for production of integrated circuits; specifically the invention provides for integration of dual damascene interconnect features (i.e. vias and trenches) in one imprint step. The present invention provides for creation of a translucent imprint mold with three-dimensional features comprising the desired dual damascene interconnect pattern. Once created, the dual damascene imprint mold is utilized to imprint the dual damascene pattern in a step and repeat fashion. In accordance with one aspect of the invention, scatterometry is used to generate observed optical signatures for comparison to known optical signatures to facilitate evaluation of the imprint mold for contamination and wear.

The methodology requires a wafer comprising a dielectric layer deposited upon an underlying substrate. The dielectric layer is the layer into which the dual damascene interconnect pattern is to be integrated. In accordance with one aspect of the invention, an organic transfer layer is then spin coated or otherwise deposited upon the dielectric layer. Subsequently, an imaging layer comprising low viscosity, photopolymerizable, organosilicon is deposited upon the transfer layer. The imprint mold is then brought into contact with the transfer layer with the organosilicon filling any gap between the imprint mold and the transfer layer. After the imprint mold is in position, the low viscosity, photopolymerizable, organosilicon is exposed by ultraviolet light through the back of the translucent imprint mold. Once exposed, the low viscosity, photopolymerizable, organosilicon cures and creates a solidified, silicon rich replica of the dual damascene features of the imprint mold.

Once patterns have been imprinted in the imaging layer, they must be transferred through to the underlying transfer layer. In accordance with one aspect of the present invention, the dual damascene pattern is transferred into the transfer layer through a sequence of four plasma etches. Further, in accordance with this aspect of the present invention, the first and second etches effectively transfer the via portions of the dual damascene pattern from the imaging layer into the transfer layer and the third and fourth etches effectively transfer the trench portions of the dual damascene pattern from the imaging layer into the transfer layer. The first etch is a halogen breakthrough etch that anisotropically removes residual organosilicon in the imaging layer corresponding to the via features of the dual damascene pattern. This breakthrough etch "breaks through" the imaging layer and exposes portions of the underlying transfer layer. The second etch is an oxygen transfer etch, which utilizes the remaining organosilicon in the imaging layer as an etch mask to transfer the via portion of the dual damascene pattern into the underlying transfer layer. The silicon in the organosilicon imaging layer, and lack of silicon in the transfer layer, provide the needed etch selectivity between the imaging layer and the transfer layer.

The third etch is a second halogen breakthrough etch that anisotropically removes residual organosilicon in the imaging layer corresponding to the trench features of the dual damascene pattern, exposing corresponding portions of the underlying transfer layer. The fourth etch is a second oxygen transfer etch, which uses the remaining organosilicon in the imaging layer as an etch mask to transfer the trench features of the dual damascene pattern into the underlying transfer layer. Once again, the silicon in the organosilicon imaging layer, and lack of silicon in the transfer layer, provide the needed etch selectivity between the imaging layer and the transfer layer.

In accordance with another aspect of the present invention, scatterometry is used to evaluate the depth of penetration into the transfer layer of the via portion of the dual damascene pattern. Scatterometry techniques are used to facilitate generation of an observed optical signature that is compared to a library of optical signatures wherein each optical signature in the library corresponds to a known depth of penetration into the transfer layer. The methodology proceeds to transfer the trench portion of the pattern only after the proper depth of transfer for the via portion of the pattern is obtained.

In accordance with yet another aspect of the present invention, the parameters of one or more etch processes may be altered based at least in part on the results of a comparison of an observed optical signature to a library of optical signatures. For example, if the observed optical signature corresponds to an insufficient depth of penetration into the transfer layer, the duration of the etch process as performed on succeeding devices is increased to allow for a deeper etch penetration. Similarly, if the observed optical signature corresponds to an over etch condition where the depth of penetration into the transfer layer is too deep, the duration of the etch process on succeeding devices is decreased to allow for a shallower etch penetration.

In accordance with another aspect of the invention, once the complete dual damascene pattern has been transferred to the transfer layer, a dielectric etch is used to transfer the pattern from the transfer layer into the dielectric layer. Once the pattern is transferred into the dielectric layer, the vias and trenches are filled with copper metallization and the wafer is then planarized to complete the dual damascene interconnect integration.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 15 illustrates a perspective view of a grid-mapped substrate in accordance with one or more aspects of the present invention.

FIG. 16 illustrates plots of measurements taken at grid-mapped locations on a substrate in accordance with one or more aspects of the present invention.

FIG. 17 illustrates a table containing entries corresponding to results of a comparison of observed optical signatures to expected optical signatures at respective grid-mapped locations on a substrate in accordance with one or more aspects of the present invention.

DETAILED DESCRIPTION OF THE INVENTION

Figure 1:
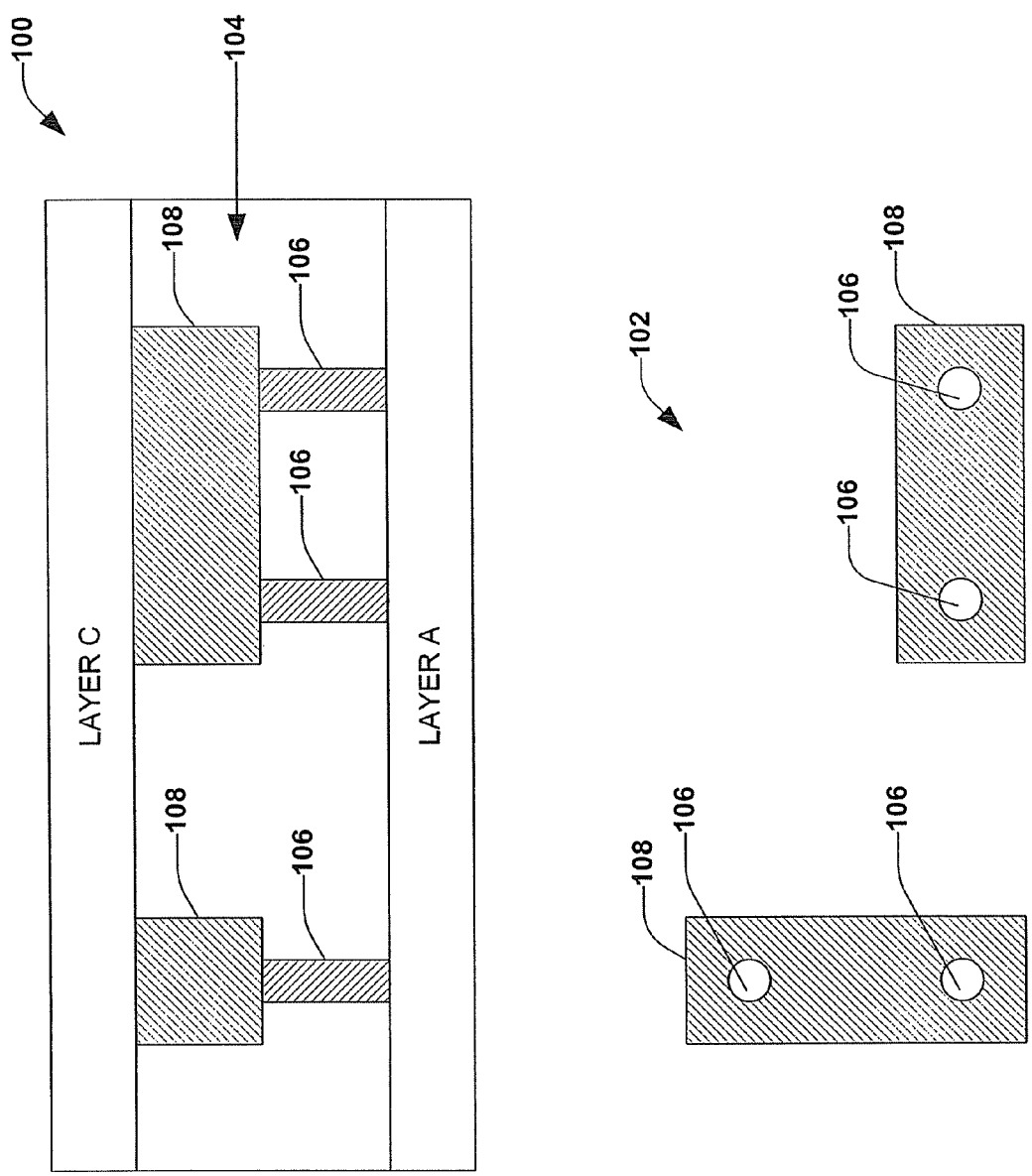
FIG. 1 is an illustration of a typical dual damascene feature utilized in a typical semiconductor substrate.

The present invention will now be described with reference to the drawings. The following detailed description is of the best mode presently contemplated by the inventors for practicing the invention. It should be understood that the description of these aspects are merely illustrative and that they should not be taken in a limiting sense.

As used in this application, the terms "mold", "imprint mold", and "imprint lithography mold" are used interchangeably to refer to an article comprising a three dimensional pattern used to imprint a pattern in deformable material utilized in the production of an integrated circuit. The terms "imprint lithography" and "nanoimprint lithography" are used interchangeably to describe a method of producing integrated circuits involving imprinting a pattern onto a resist and subsequent exposure by a source, typically ultraviolet light, to which the resist is reactive.

Furthermore, the term "component" as used in this application is intended to refer to a computer-related entity, either hardware, a combination of hardware and software, software, or software in execution. For example, a component may be, but is not limited to being a process running on a processor, a processor, an object, an executable, a thread of execution, a program, a set of co-operating computers and/or processes and a computer.

The present invention facilitates reproduction of small features required to facilitate the production of integrated circuits through imprint lithography. More specifically, the present invention provides systems and methods that facilitate the integration of dual damascene interconnect features in one imprint step.

Generally speaking, in imprint lithographic processes, a UV-transmittable quartz mask/mold is pressed into a thin film of low viscosity UV-curable monomer coated onto a substrate. Subsequent exposure of the substrate by UV-irradiation through the mask/mold results in polymerization and curing of the resist in the imprinted. Thereafter the mold is removed leaving a three-dimensional replica of its pattern in the cured imprint polymer. Finally, the residual imprint layer in the depressed areas is removed by high anisotropic reactive ion etching.

Damascene (single damascene) is an interconnection fabrication process in which grooves are formed in an insulating structure and filled with metal to form the conductive lines. Dual damascene is a multi-level interconnection process in which, in addition to forming the grooves of single damascene, the conductive via openings also are formed. Using a dual damascene process, semiconductor devices are patterned with several thousand openings for conductive lines and vias which are filled with a conductive metal, such as aluminum, copper, tungsten and gold and serve to interconnect the active and/or passive elements of the integrated circuit. The dual damascene process is also used for forming the multilevel signal lines of conductive metal in the insulating layers of multilayer substrates.

FIG. 1 is an illustration of a cross section view 100 and a corresponding top view 102 of a conventional dual damascene pattern utilized to provide electrical connections between active and/or passive elements of integrated circuit layers in a semiconductor wafer or substrate. Cross section view 100 illustrates dielectric layer 104 comprised of dielectric material, vias 106, and trenches 108. The vias 106 and trenches 108 provide electrical connections between active and/or passive elements in layers adjacent to the dielectric layer. The dual damascene pattern is utilized extensively in semiconductor wafers produced by traditional optical lithographic processes.

Figure 2:
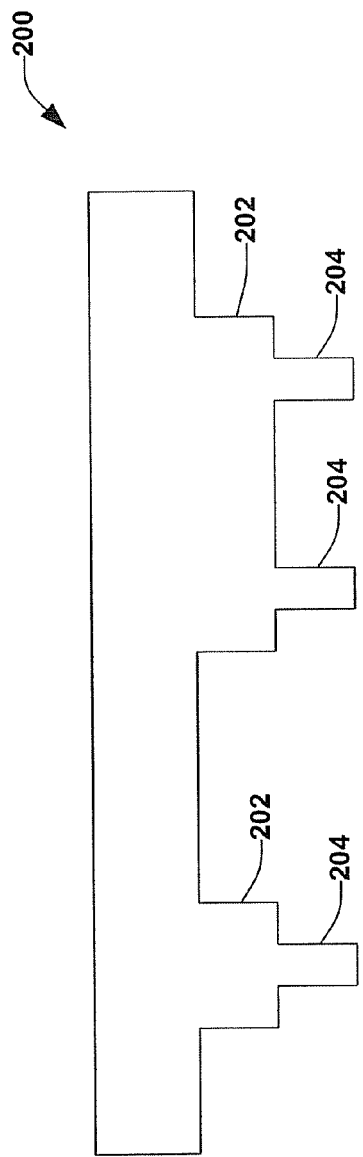
FIG. 2 is an illustration of an imprint lithography mold comprising dual damascene features in accordance with an aspect of the present invention.

For imprint lithography, the present invention provides systems and methods to facilitate the integration of dual damascene interconnect features in one imprint step. FIGS. 2 through 10 illustrate the process of producing dual damascene interconnect features utilizing a single imprint step. FIG. 2 is an illustration of a translucent imprint lithography mold 200 comprising dual damascene interconnection features in accordance with an aspect of the present invention. The pattern of mold 200 is comprised of trenches 202 and vias 204 configured as dual damascene interconnection features. Mold 200 is utilized to imprint the dual damascene pattern on a substrate which is further processed to transfer the pattern of the mold into a dielectric layer of the substrate. Mold 200 is translucent, made, for example, of quartz or silicon dioxide and facilitates exposure of the substrate by, for example, ultraviolet light, passing through the mold from a source on the side of the mold opposite the substrate.

Figure 3:
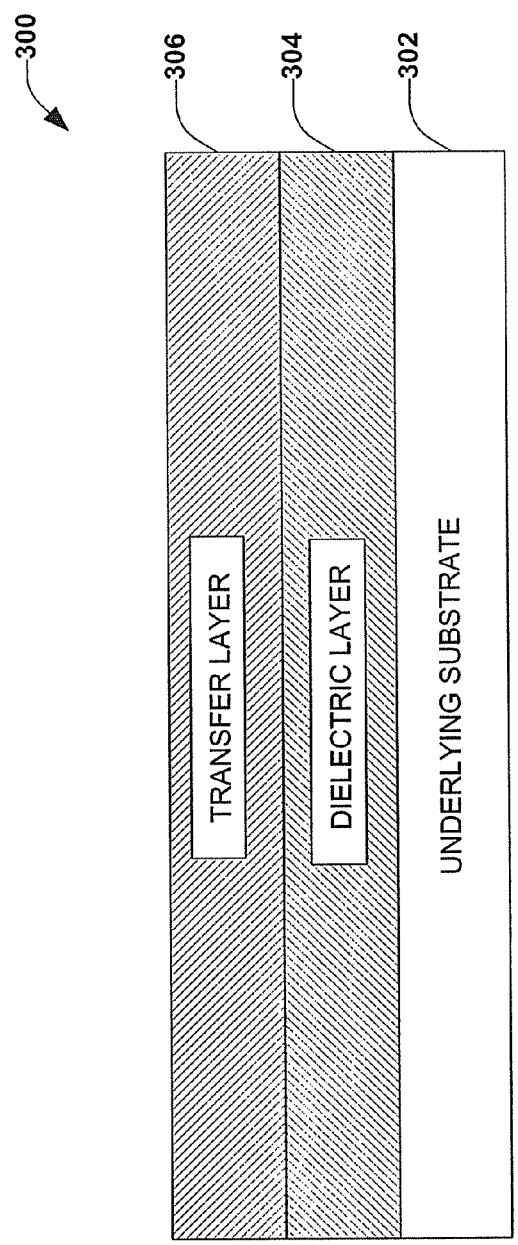
FIG. 3 is an illustration of a substrate suitable for imprint lithography in accordance with an aspect of the present invention.

FIG. 3 is an illustration of a substrate 300 suitable for imprint lithography in accordance with aspect of the present invention. Substrate 300 is comprised of an underlying substrate 302 comprising on or more layers, a dielectric layer 304 and a transfer layer 306. Underlying substrate layer 302 includes any and all layers and structures fabricated in the semiconductor up to this point in processing. Underlying substrate 302 may include one or more structures such as active elements and passive elements including polysilicon gates, wordlines, source regions, drain regions, bit lines, bases, emitters, collectors, conductive lines, conductive plugs, diffusion regions, etc.

Dielectric layer 304 is the layer into which the dual damascene interconnect structure is to be formed. Dielectric layer 304 includes dielectric material or insulating material including silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BP-TEOS), phosphosilicate glass (PSG), borophosphosilicate glass (BPSG), and other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

Transfer layer 306 facilitates transferring the pattern from a mold to dielectric layer 304. In accordance with one aspect of the present invention, transfer layer 306 comprises organic material, spin coated or otherwise deposited onto dielectric layer 304. Ideal transfer layer materials adhere to the dielectric layer and to a subsequently deposited imaging layer. The transfer layer must provide high etch rate selectivity when subjected to subsequent etch processes that facilitate transfer of the desired dual damascene pattern. Conventional photoresists such as for example HR 100 from OLIN are suitable materials for the transfer layer. It is noted that the transfer layer is not photoactive and hence is not affected by the exposure process. Instead, the etch resistive backbone of conventional photoresists (as above) is the main polymer component After the organic transfer layer is spin coated upon the dielectric layer, an imaging layer comprising low viscosity, photopolymerizable, organosilicon is deposited upon the transfer layer. The imprint mold is then brought into contact with the transfer layer with the organosilicon imaging layer filling any gap between the imprint mold and the transfer layer. After the imprint mold is in position, the low viscosity, photopolymerizable, organosilicon is exposed through the back of the translucent imprint mold by ultraviolet light, or other light suitable to cure the photopolymerizable organosilicon. Once exposed, the low viscosity, photopolymerizable, organosilicon cures and creates a solidified, silicon rich replica of the dual damascene features of the imprint mold.

Figure 4:
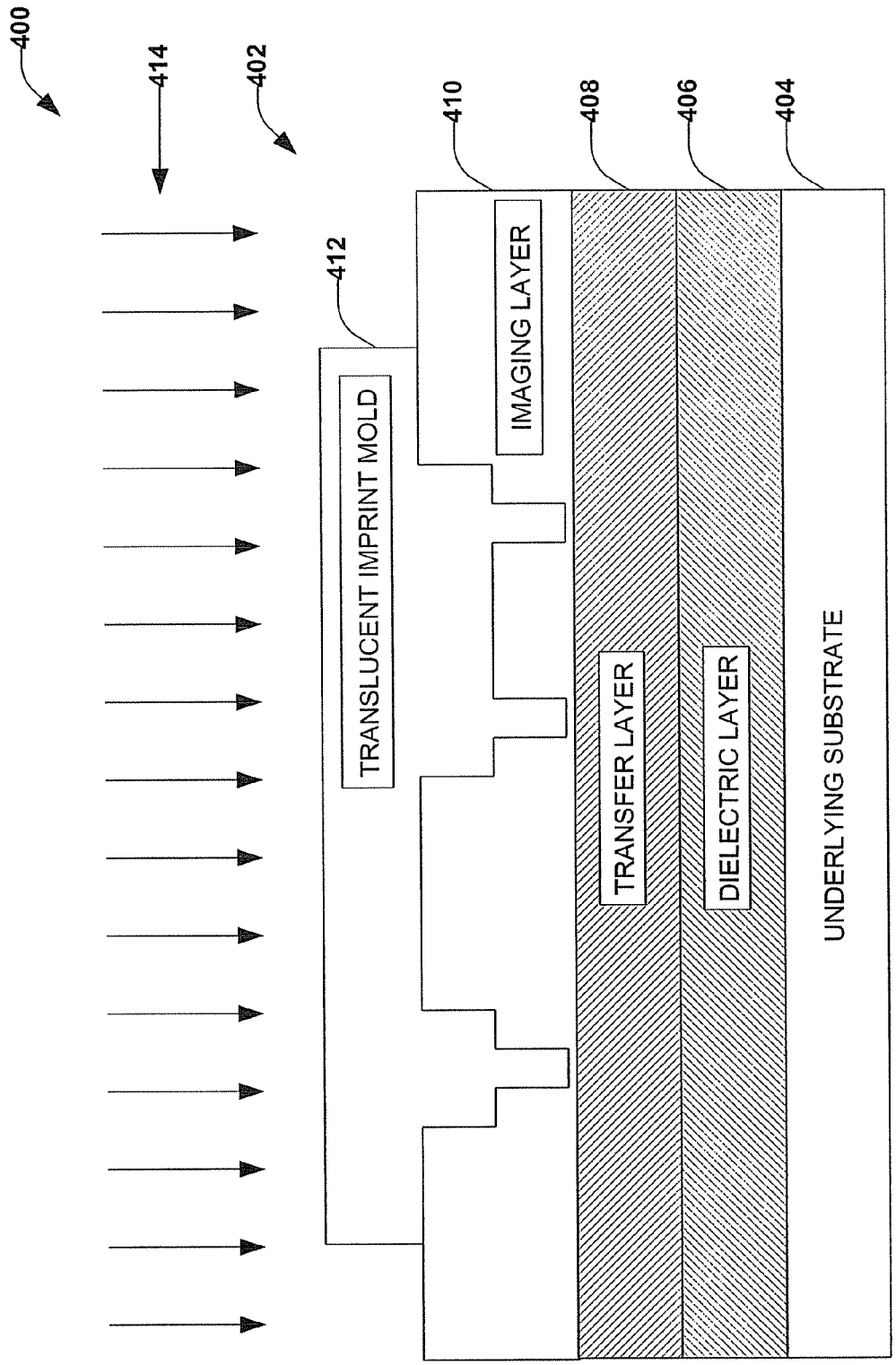
FIG. 4 is an illustration of a substrate prepared for imprint and exposure in accordance with an aspect of the present invention.

FIG. 4 is an illustration 400 of a substrate 402 prepared for imprint and exposure in accordance with an aspect of the present invention. Referring to FIG. 4, substrate 402 is comprised of underlying substrate 404, dielectric layer 406 and transfer layer 408. An imaging layer 410 is deposited upon the transfer layer 408. Imaging layer 410 comprises a low viscosity, photopolymerizable organosilicon. A translucent imprint mold 412 comprising the dual damascene pattern to be imprinted is brought into contact with transfer layer 408 with organosilicon imaging layer 410 filling any gap between imprint mold 412 and transfer layer 408. Once imprint mold 412 is properly positioned, an exposure source (not illustrated) provides illumination 414. The exposure source is a source of illumination to which the photopolymerizable imaging layer 410 is sensitive such as for example ultraviolet light. Illumination 414 passes through translucent imprint mold 412 to expose the photopolymerizable imaging layer 410. Once exposed, imaging layer 410 cures and creates a solidified, silicon rich replica of the dual damascene features of imprint mold 412.

Figure 5:
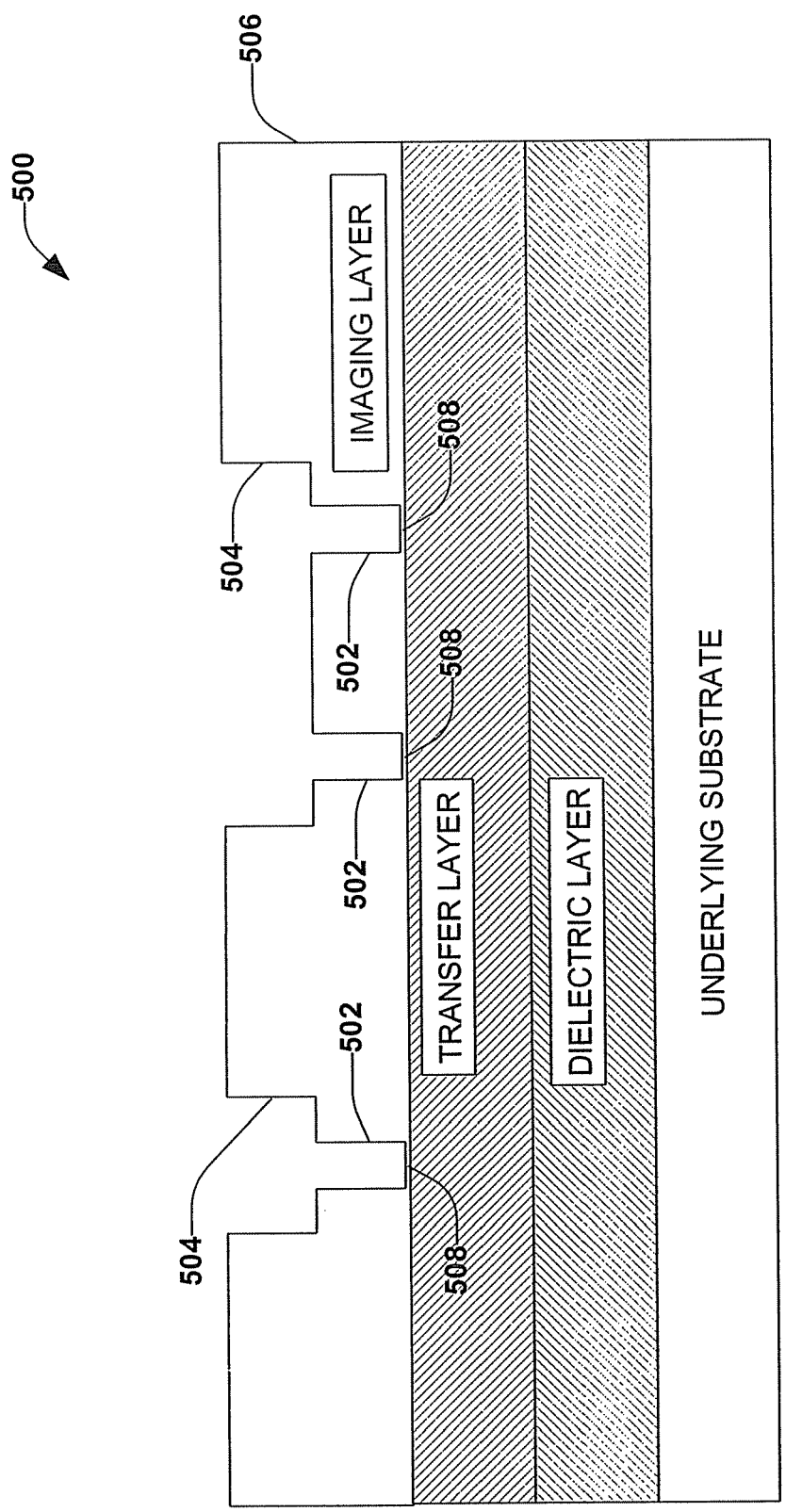
FIG. 5 is an illustration of a substrate in accordance with an aspect of the present invention.

At this point, the imprint mold is removed and the resulting substrate 500 is illustrated in FIG. 5. The pattern for the vias 502 and trenches 504 which comprise the dual damascene pattern are imprinted into solidified imaging layer 506. Once the dual damascene patterns have been imprinted in the imaging layer, the patterns must be transferred to the underlying transfer layer. In accordance with one aspect of the present invention, the pattern in the imaging layer is transferred into the transfer layer by a series of four plasma etch processes. The first plasma etch is a first halogen breakthrough etch that anisotropically removes residual organosilicon of the imaging layer to break through to the underlying transfer layer. During this step, residual portions of the imaging layer are removed between the imprint mold and the transfer layer where, ideally, all imaging material would have been forced away during the imprint process. Such residual imaging layer material might, for example, remain at bottom surfaces 508 of the vias 502 illustrated in FIG. 5. The second plasma etch process, is a first oxygen transfer etch that utilizes the remaining organosilicon material in the imaging layer as an etch mask to transfer the vias into the underlying transfer layer. The silicon in the organosilicon imaging layer and the lack of silicon in the transfer layer provide the needed etch selectivity between the imaging layer and the transfer layer. During this first oxygen transfer etch, the via portion of the dual damascene pattern is transferred into the transfer layer.

Figure 6:
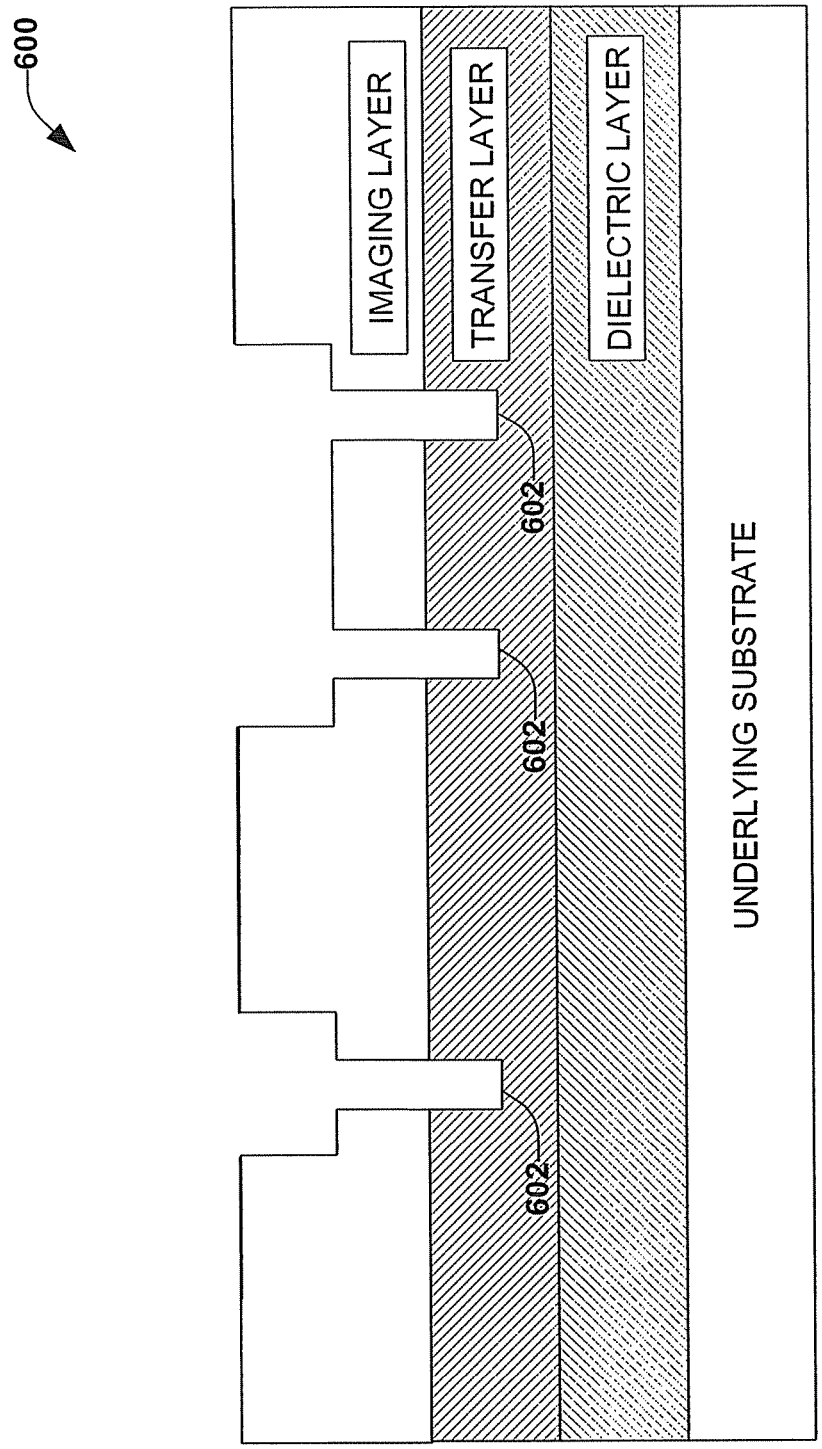
FIG. 6 illustrates a substrate after completion of an oxygen transfer etch in accordance with an aspect of the present invention.

FIG. 6 illustrates the substrate after completion of the first oxygen transfer etch. In FIG. 6, vias 602 have been transferred approximately half way through the transfer layer. The depth of the etch, referred to as the depth of penetration, is controlled by controlling and monitor various parameters of the etching process. The depth of penetration is also targeted depending on the etch selectivity of the transfer layer to the underlying dielectric layer, as well as the required ratio and absolute values of trench thickness to via thickness in the dual damascene integration. This ratio influences the electrical behavior of the circuit (coupling capacitance, interconnect resistance, critical speed paths) and needs to be controlled in order to attain optimal performance of the circuit. In FIG. 6, although not shown, some erosion of the transfer layer may occur in the breakthrough and $O_2$ processes owing to finite selectivity. Hence, the thickness of the transfer layer at the top needs may be reduced.

Figure 7:
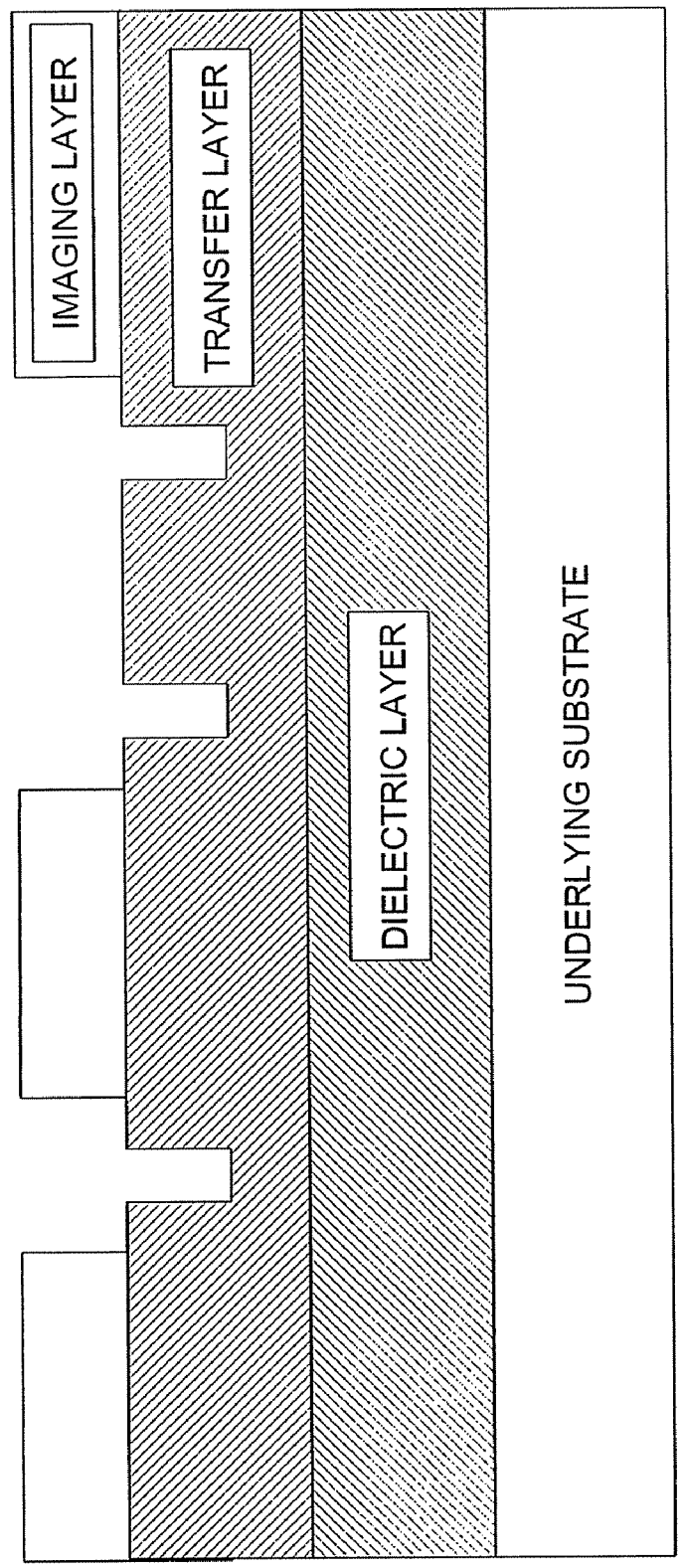
FIG. 7 illustrates a substrate after completion of a second halogen etch in accordance with an aspect of the present invention.

After completion of the first two etches that transfer the vias into the transfer layer, the sequence of a halogen breakthrough etch followed by an oxygen transfer etch is repeated to transfer the trench portion of the dual damascene pattern. FIG. 7 illustrates the substrate after completion of the third etch. The third etch is another halogen etch, (referred to as the second halogen etch) which removes additional portions of the imaging layer. During the second halogen etch, the imaging layer is reduced in thickness so that the trench portion of the pattern is removed thereby exposing more of the transfer layer. Next, the fourth etch (a second oxygen transfer etch) is performed and the trench portion of the dual damascene pattern is transferred into the transfer layer. Once again, the silicon in the organosilicon imaging layer and the lack of silicon in the transfer layer provide the needed etch selectivity between the imaging layer and the transfer layer. During this fourth etch process (the second oxygen transfer etch), the trench portion of the dual damascene pattern is transferred into the transfer layer.

Figure 8:
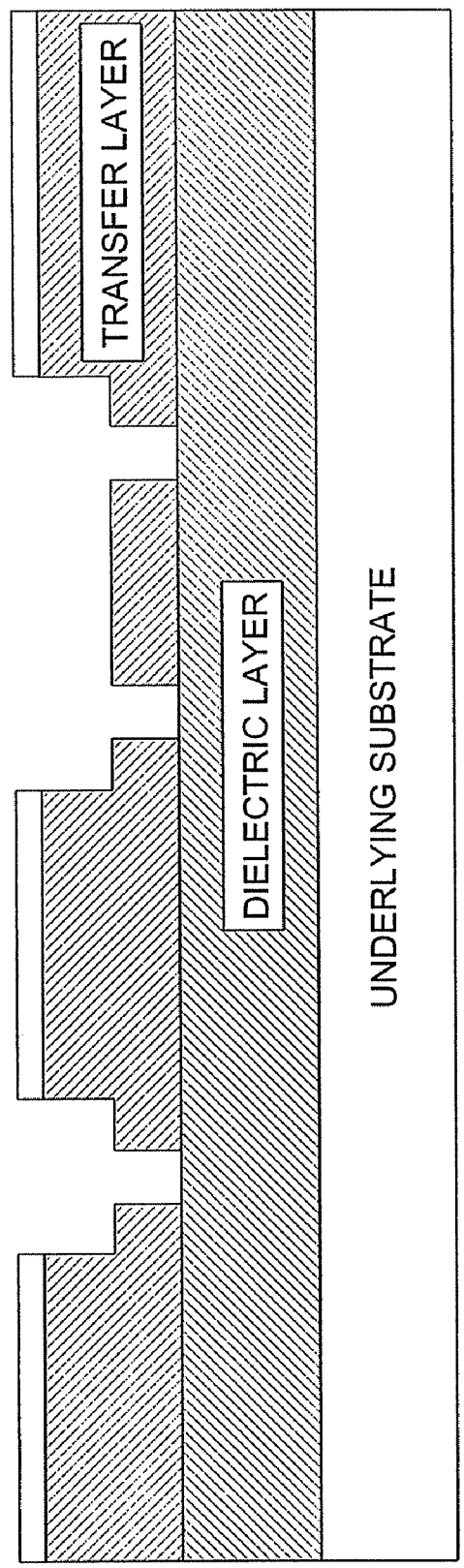
FIG. 8 illustrates a substrate after successful transfer of a dual damascene pattern from an imaging layer into a transfer layer in accordance with an aspect of the present invention.

In accordance with an aspect of the present invention, through the series of four plasma etches, (halogen break through etch followed by an oxygen transfer etch, followed by a second halogen break through etch and a second oxygen transfer etch) the dual damascene pattern is successfully transferred from the imaging layer to the transfer layer. FIG. 8 illustrates the successful transfer of the dual damascene pattern from the imaging layer to the transfer layer.

Figure 9:
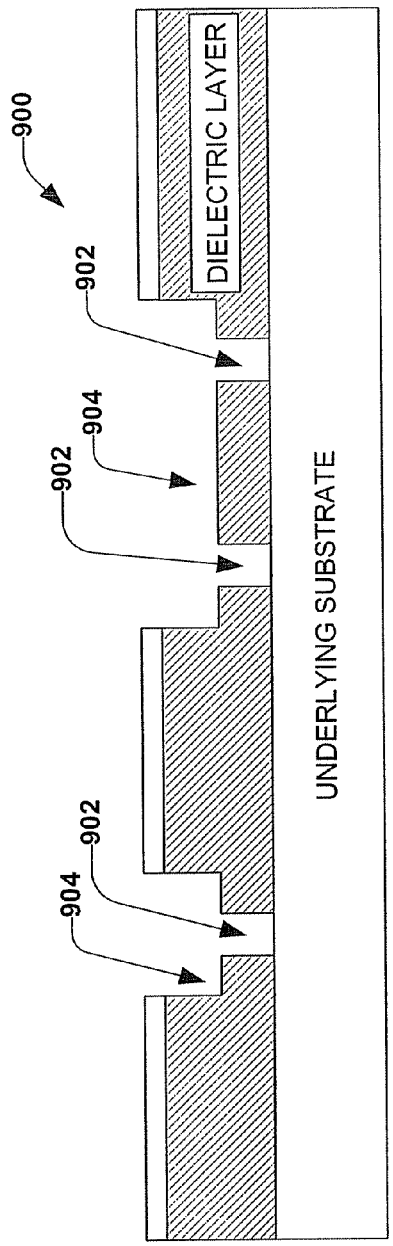
FIG. 9 is an illustration of a substrate wherein the dielectric layer comprises the vias and trenches of the dual damascene pattern in accordance with an aspect of the present invention.

Once dual damascene pattern has been transferred into the transfer layer, the dual damascene pattern must be transferred from the transfer layer into the dielectric layer. The dual damascene pattern is transferred into the dielectric layer by using an appropriate dielectric etch for the chosen dielectric. The dielectric etch process removes appropriate portions of the dielectric layer. The resulting substrate 900 is illustrated in FIG. 9 where the dielectric layer comprises the vias 902 and trenches 904 of the dual damascene pattern.

Figure 10:
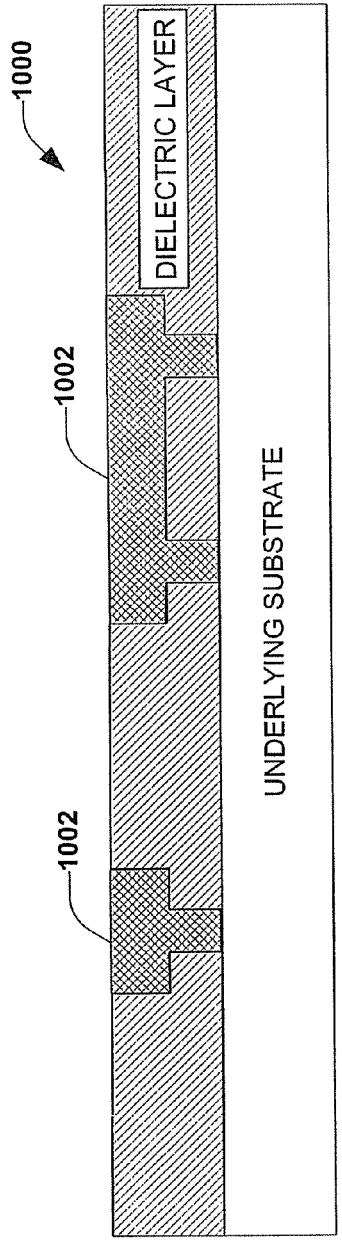
FIG. 10 is an illustration of a substrate after deposition of conductive material to fill the dual damascene openings and subsequent planarization of the resulting substrate in accordance with an aspect of the present invention.

At this point, conductive material is deposited into the vias and trenches comprising the dual damascene openings in the dielectric layer. Conductive material is deposited over the entire structure, followed by chemical mechanical polishing (CMP) to planarize the structure. Suitable conductive materials include copper, tungsten, gold, silver, aluminum, any alloys and/or combinations thereof. FIG. 10 illustrates the substrate 1000 after deposition of the conductive material 1002 and planarization of the resulting substrate. The substrate is now ready for additional layers to be created on top of the dual damascene interconnect features.

Figure 11:
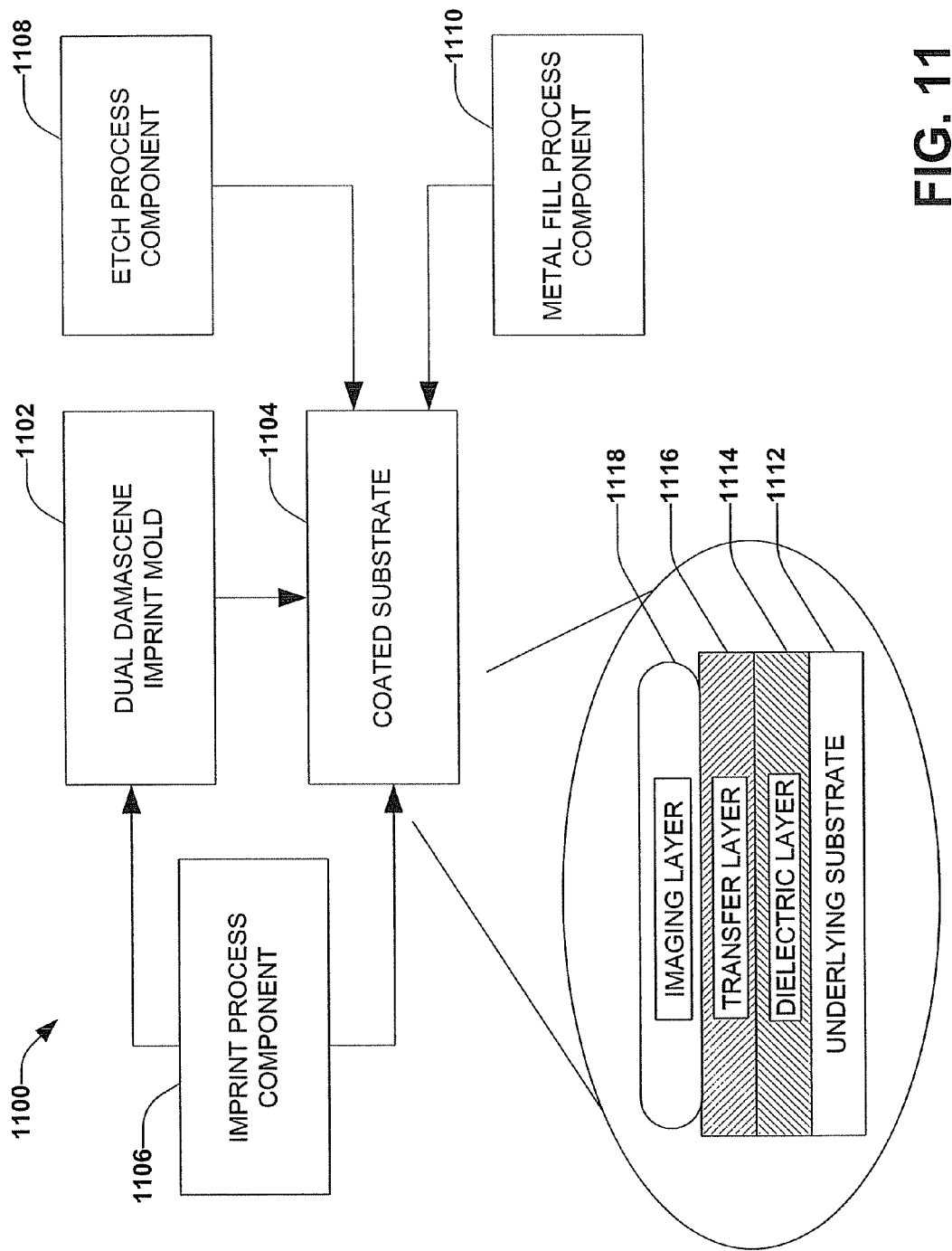
FIG. 11 is an illustration of a high level block diagram of a system for integrating dual damascene interconnect patterns in one imprint step in accordance with an aspect of the present invention.

Referring now to FIG. 11, a high level block diagram of a system 1100 for integrating dual damascene interconnect patterns in one imprint step in accordance with an aspect of the present invention is illustrated. The system comprises dual damascene imprint mold 1102, coated substrate 1104, imprint process component 1106, etch process component 1108 and metal fill process component 1110. Dual damascene imprint mold 1102 comprises one or more dual damascene patterns to be transferred to coated substrate 1104. Imprint mold 1104 is comprised of translucent quartz, however it is understood that the mold may be comprised of any translucent material suitable for imprinting the desired pattern, such as, for example, silicon dioxide, fused quartz, etc.

Coated substrate 1104 comprises an underlying substrate 1112, a dielectric layer 1114, and a transfer layer 1116. Underlying substrate layer 1112 includes any and all layers and structures fabricated in the semiconductor substrate up to this point of processing. Underlying substrate 1112 may include one or more structures such as active elements and passive elements including polysilicon gates, wordlines, source regions, drain regions, bit lines, bases, emitters, collectors, conductive lines, conductive plugs, diffusion regions, etc.

Dielectric layer 1114 is the layer into which the dual damascene interconnect pattern is to be integrated. Dielectric layer 1114 includes dielectric material or insulating material including silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BP-TEOS), phosphosilicate glass (PSG), borophosphosilicate glass (BPSG), and other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

Transfer layer 1116 facilitates the transfer of the dual damascene pattern from imprint mold 1104 to dielectric layer 1114. In accordance with one aspect of the present invention, transfer layer 1116 comprises organic material, spin coated or otherwise deposited onto dielectric layer 1114. Ideal transfer layer materials adhere to the dielectric layer and to a subsequently deposited imaging layer. The transfer layer provides high etch rate selectivity when subjected to subsequent etch processes that facilitate transfer of the dual damascene pattern. Conventional photoresists such as HR 100 from OLIN are suitable materials for the transfer layer.

Organosilicon imaging layer 1118 is deposited upon transfer layer 1116. This imaging layer may be deposited by imprint process component 1106 immediately before an imprint step in a step and repeat process or may alternatively be spin coated or otherwise deposited across the entire transfer layer prior to imprinting the dual damascene pattern with imprint mold 1102. Imprint process component 1106 comprises components which control and effectuate a contact process and a subsequent exposure process. Imprint process component 1106 brings imprint mold 1102 into contact with organosilicon coated substrate 1104. Imaging layer 1118 is then exposed to a flood of ultraviolet light from the imprint process component. The ultraviolet light exposes and cures the organosilicon imaging layer 1118. Imprint process component 1106 then separates the imprint mold from the coated substrate. After exposure, the cured organosilicon imaging layer contains a replica of the dual damascene pattern of imprint mold 1102.

Etch process component 1108 effectuates a series of etches (two sets of halogen breakthrough etches followed by oxygen transfer etches) that facilitate the transfer of the pattern in the cured organosilicon imaging layer 1118 to transfer layer 1116 and a subsequent dielectric etch that facilitates transfer of the dual damascene pattern from the transfer layer to dielectric layer 1114. Metal fill process component 1110 comprises the necessary components to fill the dual damascene vias and trenches with an appropriate metal fill, such as for example copper, tungsten, gold, silver, aluminum, any alloys and/or combinations thereof and subsequently to planarize the resulting substrate.

Figure 12:
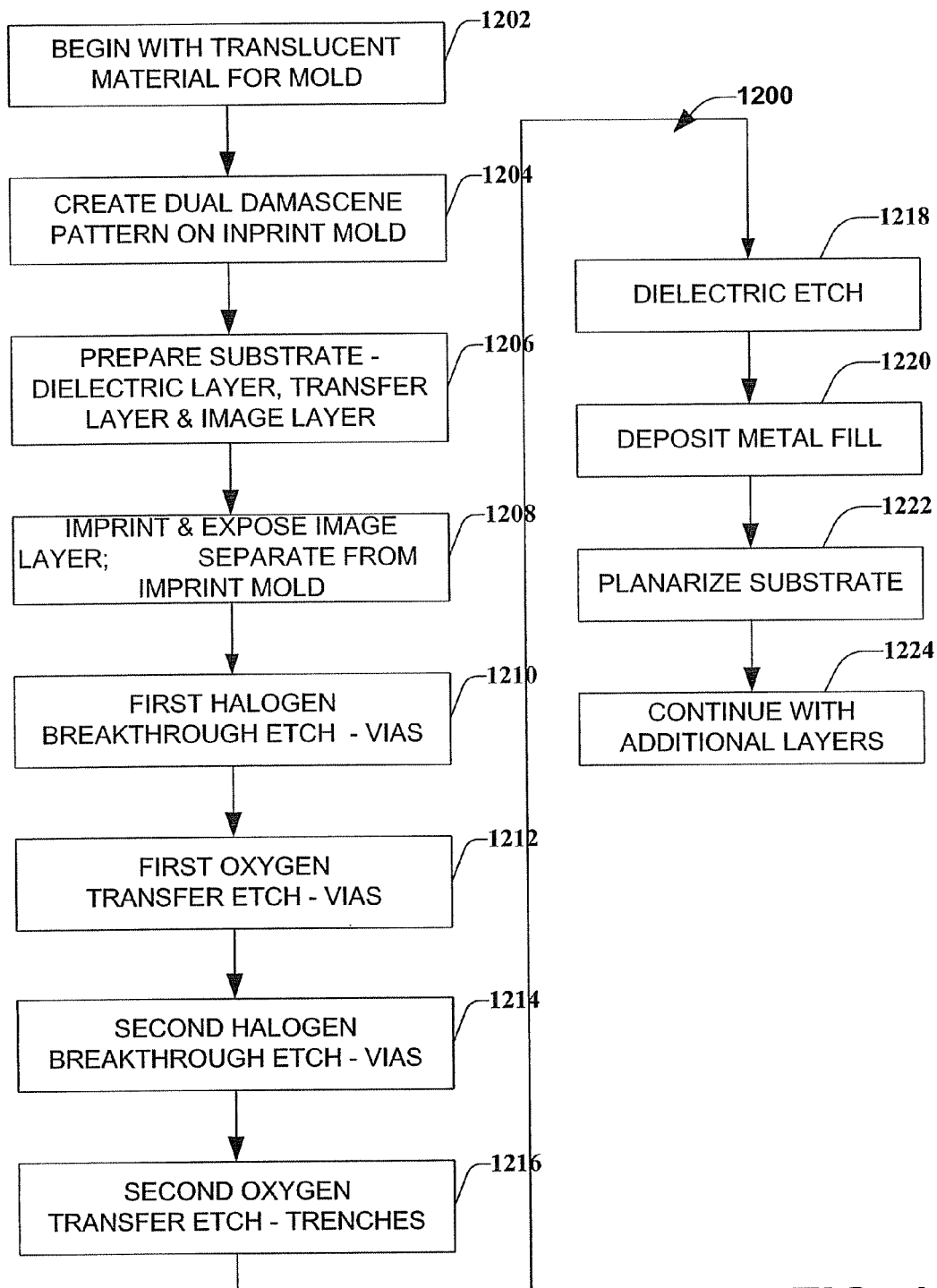
FIG. 12 is an illustration of a methodology to facilitate integration of a dual damascene pattern in one imprint step in accordance with an aspect of the present invention.

In view of the exemplary systems shown and described above, methodology 1200 which may be implemented in accordance with the present invention, will be better appreciated with reference to the flow diagram illustrated in FIG. 12. While, for purposes of simplicity of explanation, methodology 1200 is shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware, a combination thereof, or any suitable means (e.g., device, system, process, component, etc.) for carrying out the functionality associated with the blocks. It is also to be appreciated that the blocks are merely to illustrate certain aspects of the present invention in a simplified form and that these aspects may be illustrated via a lesser and/or greater number of blocks.

FIG. 12 is an illustration of a methodology 1200 to facilitate integration of a dual damascene pattern in one imprint step. Referring to FIG. 12, methodology 1200 begins at 1202 with a translucent material suitable for imprint lithography. At 1204, the translucent material is processed to create the dual damascene pattern to be integrated into a dielectric layer of a substrate. The translucent imprint mold is created by a series of lithographic exposures and etches suitable for the material comprising the mold. The resulting dual damascene imprint mold comprises a three dimensional representation of the vias and trenches of the dual damascene pattern to be transferred.

The methodology continues at 1206 where a substrate is prepared for imprint with the dual damascene imprint mold. The substrate is prepared by creating a suitable dielectric layer, transfer layer and imaging layer upon an underlying substrate. The dielectric layer is the layer into which the dual damascene pattern will ultimately be integrated. The dielectric layer includes dielectric material or insulating material including silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BP-TEOS), phosphosilicate glass (PSG), borophosphosilicate glass (BPSG), and other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

A transfer layer is then deposited upon the dielectric layer. In accordance with one aspect of the present invention, the transfer layer facilitates transferring the pattern from the imaging layer to the dielectric layer. The transfer layer comprises organic material, spin coated or otherwise deposited onto the dielectric layer. Ideal transfer layer materials adhere to the dielectric layer and to a subsequently deposited imaging layer. The transfer layer provides high etch rate selectivity when subjected to subsequent etch processes that facilitate the transfer of the desired dual damascene pattern. Conventional photoresists such as for example HR 100 from OLIN are suitable materials for the transfer layer.

After the organic transfer layer is spin coated or otherwise deposited upon the dielectric layer, an imaging layer comprising low viscosity, photopolymerizable, organosilicon is deposited upon the transfer layer.

Once the substrate has been prepared, the methodology continues at 1208. At 1208 the imprint mold is brought into contact with the prepared substrate with the organosilicon filling any gap between the imprint mold and the transfer layer. After the imprint mold is in position, the low viscosity, photopolymerizable, organosilicon is exposed through the back of the translucent imprint mold by ultraviolet light, or other light suitable to cure the photopolymerizable, organosilicon. Once exposed, the low viscosity, photopolymerizable, organosilicon cures and creates a solidified, silicon rich replica of the dual damascene features of the imprint mold. The imprint mold is then separated from the cured imaging layer.

At 1210, a first halogen breakthrough etch is performed which removes any residual portion of the imaging layer remaining between the via features of the imprint mold and the transfer layer. The first breakthrough etch exposes portions of the transfer layer corresponding to the via portions of the dual damascene pattern. After the appropriate areas of the transfer layer are exposed, a first oxygen transfer etch is performed at 1212 which transfers the via portion of the dual damascene pattern from the imaging layer into the transfer layer.

After transfer of the via portion of the dual damascene pattern is complete, a second halogen breakthrough etch is performed at 1214. The second halogen etch removes the portions of the imaging layer corresponding to the trenches of the dual damascene pattern, exposing corresponding portions of the transfer layer. The second halogen breakthrough etch is followed by a second oxygen transfer etch at 1216 which transfers the trench portion of the dual damascene pattern from the imaging layer into the transfer layer.

Upon completion of the second transfer etch, the entire dual damascene pattern has been transferred from the imaging layer into the transfer layer. At 1218 a dielectric etch is performed that transfers the dual damascene pattern form the transfer layer to the dielectric layer. At 1220 a conductive material is deposited in the vias and trenches of the dual damascene openings of the dielectric layer. Suitable conductive materials include copper, tungsten, gold, silver, aluminum, any alloys and/or combinations thereof. Conductive material is deposited over the entire structure, followed by chemical mechanical polishing (CMP) at 1222 to planarize the structure and complete integration of the dual damascene pattern into the dielectric layer. At 1224 the methodology continues with the processing necessary to fabricate additional layers on top of the dielectric layer comprising the dual damascene pattern.

Figure 13:
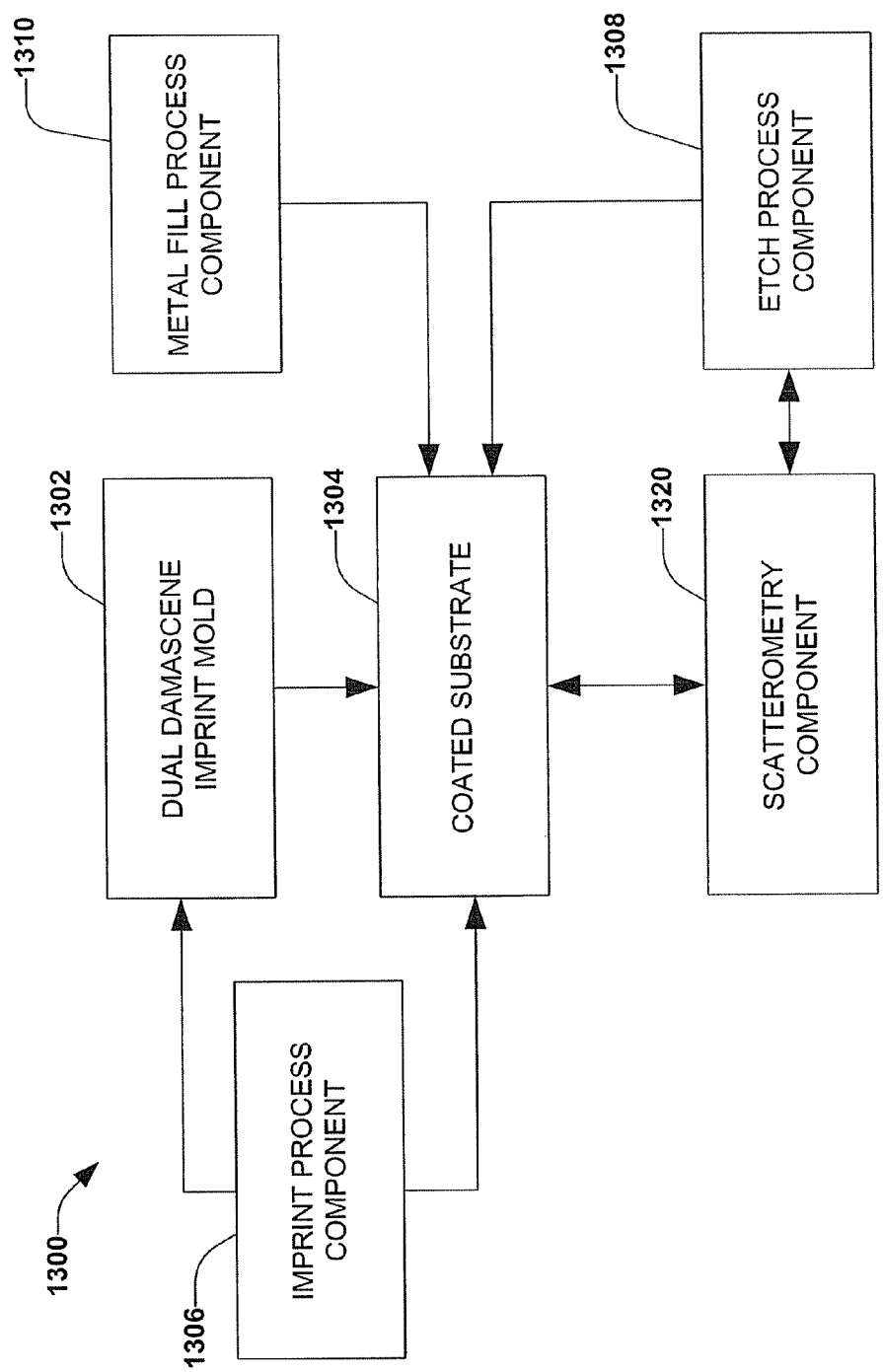
FIG. 13 is an illustration of another exemplary system for integrating dual damascene interconnect patterns in one imprint step in accordance with an aspect of the present invention.

FIG. 13 is an illustration of another exemplary system in accordance with an aspect of the present invention. In accordance with this aspect of the present invention, scatterometry techniques are used to monitor and control the formation of the dual damascene structure at one or more steps in the process. The system of FIG. 13 comprises dual damascene imprint mold 1302, coated substrate 1304, imprint process component 1306, etch process component 1308, metal fill process component 1310 and scatterometry component 1320.

Scatterometry is a technique for extracting information about a surface upon which an incident light has been directed. Information concerning properties including, but not limited to, dishing, erosion, profile, chemical composition, thickness of thin films and critical dimensions of features present on a surface such as a substrate or substrate coating can be extracted. The intensity and/or the phase of a reflected and/or diffracted beam of light will change based on properties of the surface upon which the light is directed. Information can be extracted by evaluating the wavelength, phase and/or intensity of light received at various locations of a detector. In accordance with one aspect of the present invention, scatterometry techniques are used to monitor and/or control the formation of vias and/or trenches in one or more of the imaging layer, transfer layer, and dielectric layer. In accordance with another aspect of the present invention, scatterometry is utilized to evaluate the features of the imprint mold.

The presence of dual damascene patterns on a surface of a substrate will have varying effects on the wavelength, intensity and/or phase of light reflected/diffracted off the surface of the substrate depending upon the position of the dual damascene vias and trenches (i.e. features) and the depth of penetration of the features into the surface layer. As used in this application, the wavelength, intensity, and phase of a light are referred to as characteristics of the light. Analysis by scatterometry or other similar techniques reveals a substantially unique set of characteristics for a given condition of a surface. The unique set of characteristics is referred to as an optical signature. When the reflected and/or diffracted beams are analyzed by scatterometry, a signature generated as a result of the detected location, wavelength, intensity, phase, etc. can be pattern matched, for example, to a library of signatures to determine whether the observed optical signature corresponds to a reference optical signature stored within the signature library. The signature library can be populated from prior observed optical signatures and/or optical signatures generated by modeling and simulation. Thus, in accordance with an aspect of the present invention, a determination can be made concerning the dual damascene patterns on a substrate by pattern matching an observed optical signature to a library of optical signatures. For example, the depth of penetration of the features in a layer can be determined by pattern matching an observed optical signature to a library of optical signatures. In accordance with another aspect of the present invention, one or more etching processes are controlled based at least in part on results from pattern matching an observed signature to a library of optical signatures.

A signature for known ideal conditions associated with a particular pattern on a particular layer of a substrate at a particular point in a process can be observed and stored in a signature library within a data store or memory. In accordance with one aspect of the present invention, this known good signature is used as a reference signature against which actual observed signatures are compared. Similar signatures may be observed for known incomplete processing conditions such as for example insufficient depth of penetration in an oxygen transfer etch of a via pattern into a transfer layer.

In accordance with another aspect of the present invention, simulation and modeling can be employed to produce signatures for the library against which observed signatures can be matched. For example, for a given dual damascene pattern, a simulation can provide an expected optical signature that should be generated when etching of the via pattern into the transfer layer is optimal. Similarly, through simulation and modeling, an expected signature can be produced for insufficient etching, over etching, and a range of optimal depth of penetration for any particular pattern in any given layer associated with any given etching process. In accordance with another aspect of the present invention, optical signatures obtained through simulation and modeling can be combined with prior observed optical signatures to form the signature library. In accordance with another aspect of the present invention, by matching a real-time observed optical signature to a known condition reference optical signature produced either by actual observation or through simulation and modeling, the condition of the dual damascene pattern on a surface of a substrate can be determined. In accordance with yet another aspect of the present invention, a system can determine whether to alter an etching process, based at least in part upon such information.

Figure 14:
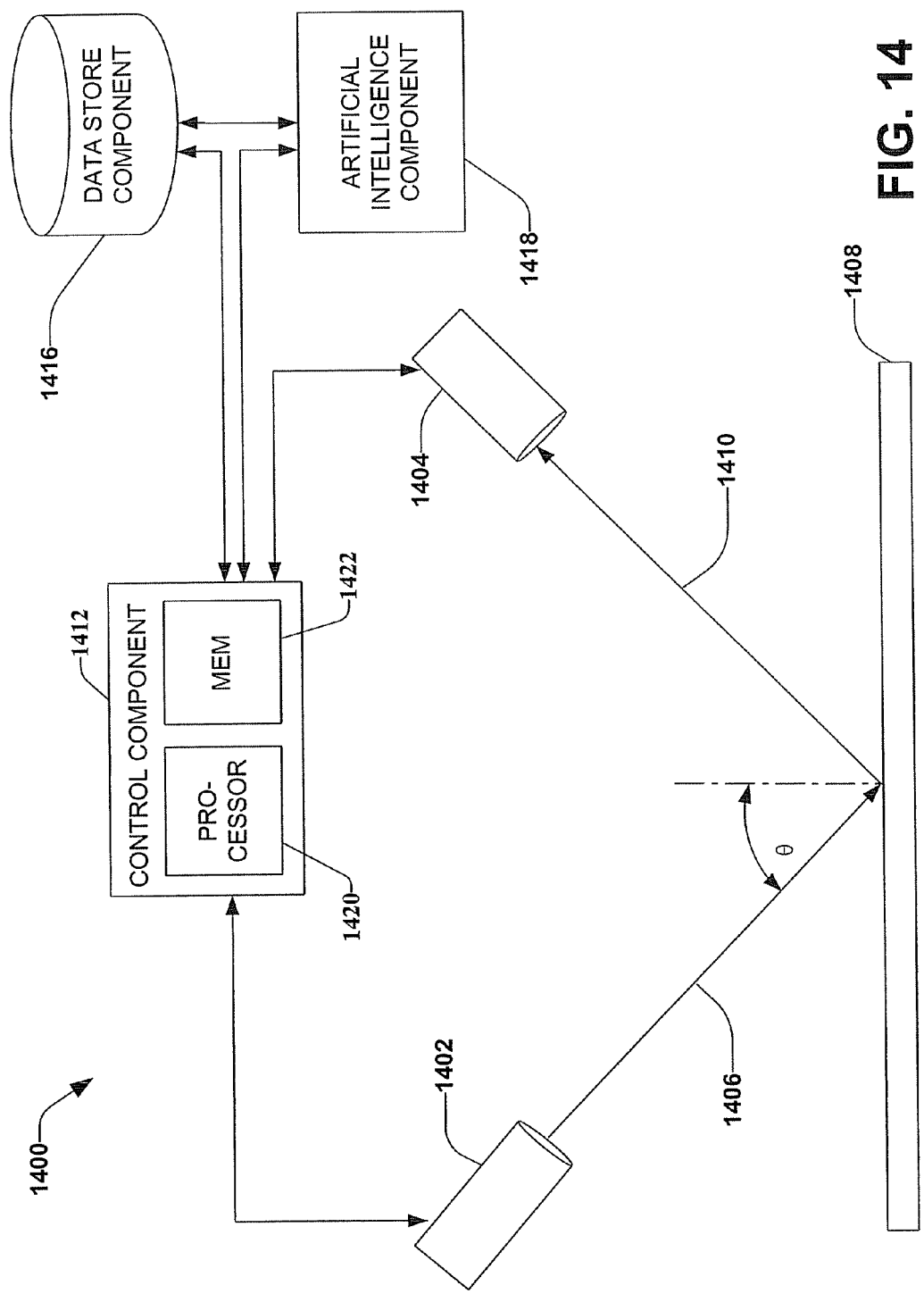
FIG. 14 is an illustration of a scatterometry component in accordance with an aspect of the present invention.

FIG. 14 is an illustration of a scatterometry component 1400 in accordance with an aspect of the present invention. Scatterometry component 1400 is comprised of light source 1402, such as one or more optical emitters, and detector 1404 such as one or more optical detectors. Light source 1402 is the source of incident light beam 1406 emitted toward substrate 1408 at an incident angle θ relative to a normal reference line. Light source 1402 is a frequency stabilized laser; however it is understood that any suitable light source (e.g., laser diode, or helium neon (HeNe) gas laser, halogen lamp, mercury lamp, UV light source, E-UV light source, etc.) can be utilized in connection with the present invention. At least a portion of incident beam 1406 is reflected and/or diffracted off substrate 1408 as reflected/diffracted beam 1410.

One or more optical detectors 1404 receive the reflected/diffracted beam 1410 and further operate to determine characteristics (i.e. wavelength, phase, intensity) of the light reaching the detectors. Information can be extracted from the light reaching the optical detectors about the surface of the substrate from which the light is reflected and/or diffracted. In accordance with one aspect of the present invention, scatterometry techniques are applied to light that is reflected and/or diffracted off of one or more of the imaging layer, the transfer layer, and the dielectric layer.

Optical detector 1404 includes a spectrometer or other instrument capable of providing spectrally-resolved information concerning the reflected/diffracted beam 1410. The portion of the reflected/diffracted beam 1410 that enters optical detector 1404 for analysis is determined at least in part by the reflection/diffraction characteristics of substrate 1408 along with properties of optical detector 1404 and any associated optical elements used in conjunction with optical detector 1404.

Optical detector 1404 collects light that is reflected and/or diffracted by the dual damascene features of the substrate 1404. Scatterometry component 1400 can be utilized to determine the dimensions, including the depth of penetration, of dual damascene features in the substrate surface by comparing wavelength, phase and/or intensity of the light received at various locations within optical detector 1404 to known set of reference wavelength, phase and/or intensity characteristics at corresponding locations within optical detector 1404. The location, wavelength, intensity and/or phase of the reflected and/or diffracted light received at various locations of optical detector 1404 constitute an optical signature. The optical signature received by the detector 1404 will change based on the dimensions of the features on the substrate surface 1408. Known optical signatures for known dimensions, locations, etc. for a given dual damascene pattern may be stored in data store component 1416 for comparison to an observed optical signature.

Scatterometry component 1400 further comprises control component 1412, data store component 1416 and artificial intelligence component 1418. Control component 1412 further comprises processor 1420 and memory 1422. Processor 1420 may be any of a plurality of processors, such as the AMD K7, the AMD Athlon™, the AMD Duron™, and other similar and/or compatible processing units. Control component 1412 may be programmed to control and operate the various components in order to carry out the various functions described herein.

Memory 1422 stores program code executed by processor 1420 for carrying out operating functions. Memory 1422 also serves as a storage medium for temporarily storing information. By way of illustration and not limitation, the memory 1422 can hold patterns or optical signatures or other data to which observed (measured) data can be compared. Memory 1422 also serves as a storage medium for temporarily storing data such as trench etch process parameters, measured wafer and/or layer dimensions, trench etch process progress values, trench etch process progress tables, component coordinate tables, wafer and/or layer shapes and sizes, scatterometry information, achieved wafer and/or layer dimensions, desired wafer and/or layer dimensions as well as other data that may be employed to facilitate the performance of the present invention.

Memory 1422 can be volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

In accordance with one aspect of the present invention, control component 1412 facilitates the evaluation of the surface of substrate 1408. According to this aspect of the present invention, control component 1412 is operatively coupled to light source 1402, optical detector 1404, data store component 1416 and artificial intelligence component 1418. By comparing observed optical signatures of light received by optical detector 1404 to acceptable optical signatures stored in either memory 1422 or data store component 1416, evaluation can be made as to the progress of etching processes that facilitate transfer of dual damascene patterns to various layers of substrate 1408.

In accordance with another aspect of the present invention, known optical signatures for known dimensions, locations, etc. for a given dual damascene pattern may be stored in data store component 1416 for comparison to an observed optical signature. According to this aspect of the invention, data store component 1416 is utilized to store a library of optical signatures representing both acceptable and unacceptable optical signatures. Acceptable optical signatures correspond to a range of acceptable characteristics such as for example a range of acceptable depths of penetration resulting from an oxygen transfer etch of dual damascene features into a transfer layer. Similarly, unacceptable optical signatures may correspond for example to a range of inadequate depths of penetration resulting from an insufficient oxygen transfer etch of via and/or trench features into a transfer layer and/or excessive depths of penetration from over etching of features too deep into the transfer layer.

In accordance with another aspect of the present invention, control component 1412, in conjunction with artificial intelligence component 1418, determines a next appropriate action based at least in part on the results of a comparison of an observed optical signature to a stored optical signature. For example, if the comparison of an observed optical signature to a library of stored optical signatures indicates inadequate depth of penetration of vias into a transfer layer resulting from an oxygen transfer etch, it may be determined that additional etching time is required to achieve the proper depth of penetration into the transfer layer. In accordance with yet another aspect of the present invention, such information may be fed forward to alter the etching process for subsequent etches to achieve deeper penetration into the transfer layer during the next etching cycle. Additionally or alternatively, the etching process may be resumed on the substrate in question to achieve an acceptable depth of penetration.

Described below are two examples for purposes of illustration and not limitation on how generation of observed optical signatures for comparison to a library of optical signatures (referred to as scatterometry and comparison) is used in accordance with an aspect of the present invention. It is to be understood that scatterometry and comparison may be used in conjunction with any of the steps involved in the creation and transfer of dual damascene patterns in any of the substrate layers.

First, in accordance with one aspect of the present invention, scatterometry and comparison is used to evaluate the depth of penetration of the features into the transfer layer for purposes of controlling a first oxygen etch process. The first oxygen etch process effectuates the transfer of the via portions of a dual damascene interconnect feature. Scatterometry and comparison is used to determine when the depth of the vias as etched into the transfer layer are within an acceptable range before proceeding onto a subsequent imaging layer breakthrough etch to facilitate the transfer of trench portions of a dual damascene pattern.

Second, in accordance with another aspect of the present invention, scatterometry and comparison is used to evaluate an imaging layer for purposes of controlling a breakthrough etch of the imaging layer. Scatterometry and comparison is used to determine when enough imaging material has been removed so as to terminate the halogen breakthrough etch and begin an oxygen transfer etch into the transfer layer to facilitate the transfer of the trench portions of dual damascene patterns.

In accordance with one or more aspects of the present invention, FIG. 15 illustrates how a substrate 1502 may be partitioned for purposes of examining a surface of a substrate. In FIG. 15, substrate 1502, situated on a stage 1504, is logically partitioned into grid blocks. Each grid block (XY) of the grid pattern corresponds to a particular portion of substrate 1502. The desired dual damascene pattern associated with each grid block is a known pattern for which known optical signatures exist either from actual observation or through simulation and modeling. Each grid block portion is evaluated during processing of substrate 1502 and a corresponding signature is determined and evaluated for each grid block location.

In FIG. 16, one or more portions of the substrate grid blocks ($X_1Y_1 \ldots X_{12}, Y_{12}$) are evaluated by a scatterometry system for optical signatures using reflected and/or diffracted light. It is to be appreciated that although FIG. 16 illustrates a substrate partitioned into 144 grid block portions, the substrate may be partitioned into any suitable number of grid blocks. Given a set of acceptable expected optical signatures, a scatterometry system can determine if the dual damascene patterns in a surface match the characteristics of a desired dual damascene pattern by comparing the observed optical signature to the set of expected optical signatures. Similarly, the scatterometry system may generate feed forward information which can facilitate maintaining, terminating, and/or altering an etching process based at least in part on the results of comparing the observed optical signature to a set of acceptable optical signatures.

FIG. 17 illustrates a table 1700 recorded with results from comparing an observed optical signature to an expected optical signature for the individual grid block locations. In table 1700, SE indicates that the observed signature matched the expected signature and Su indicates that the observed signature was unexpected and did not match the expected signature for the given grid block location. It can be seen that all the signatures are expected except a signature for grid block location $X_7Y_6$. The table of results can be analyzed for the desired pattern characteristics in specific grid block locations.

Figure 18:
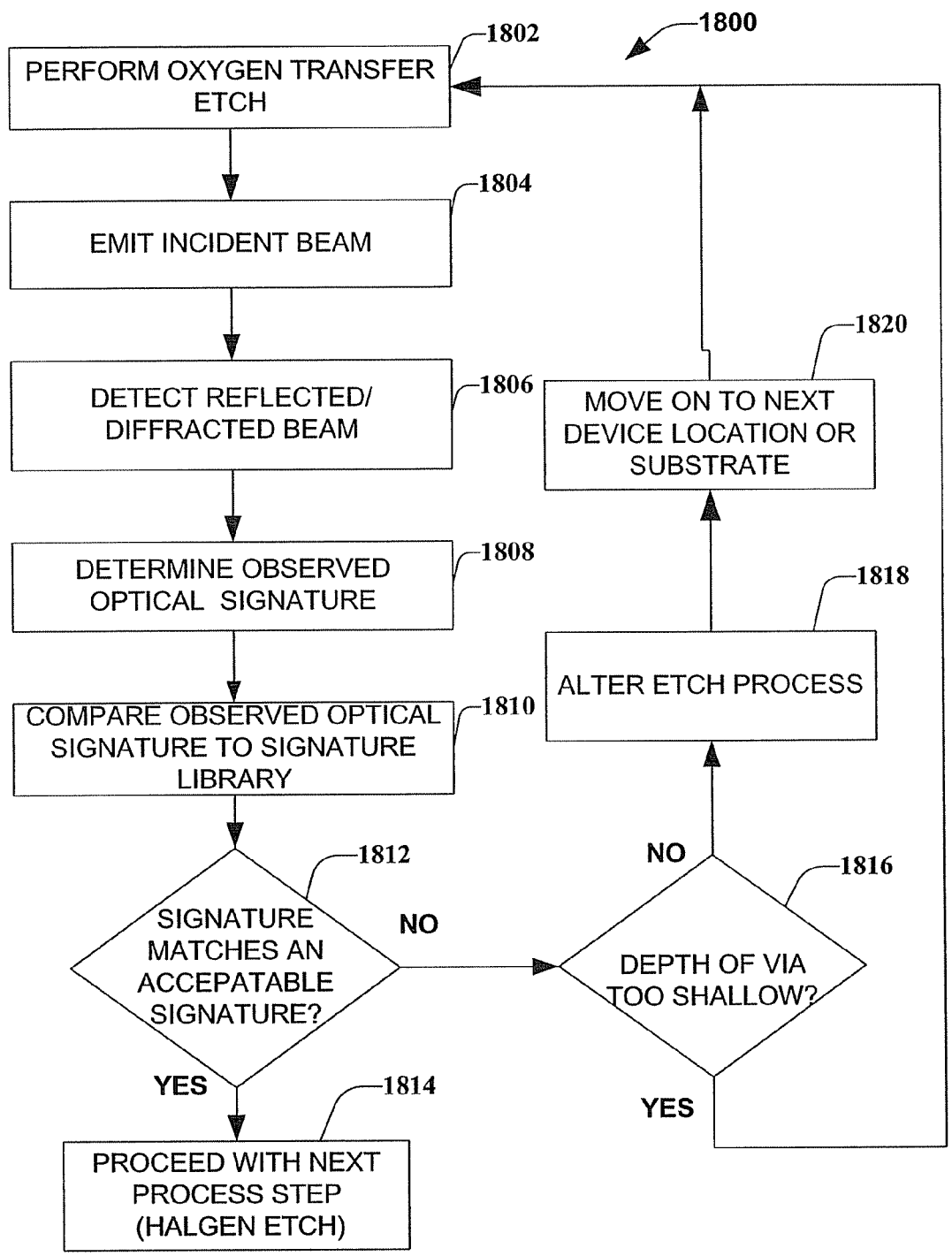
FIG. 18 is an illustration of a methodology that utilizes scatterometry on the surface of a substrate to evaluate pattern transfer in accordance with an aspect of the present invention.
Figure 19:
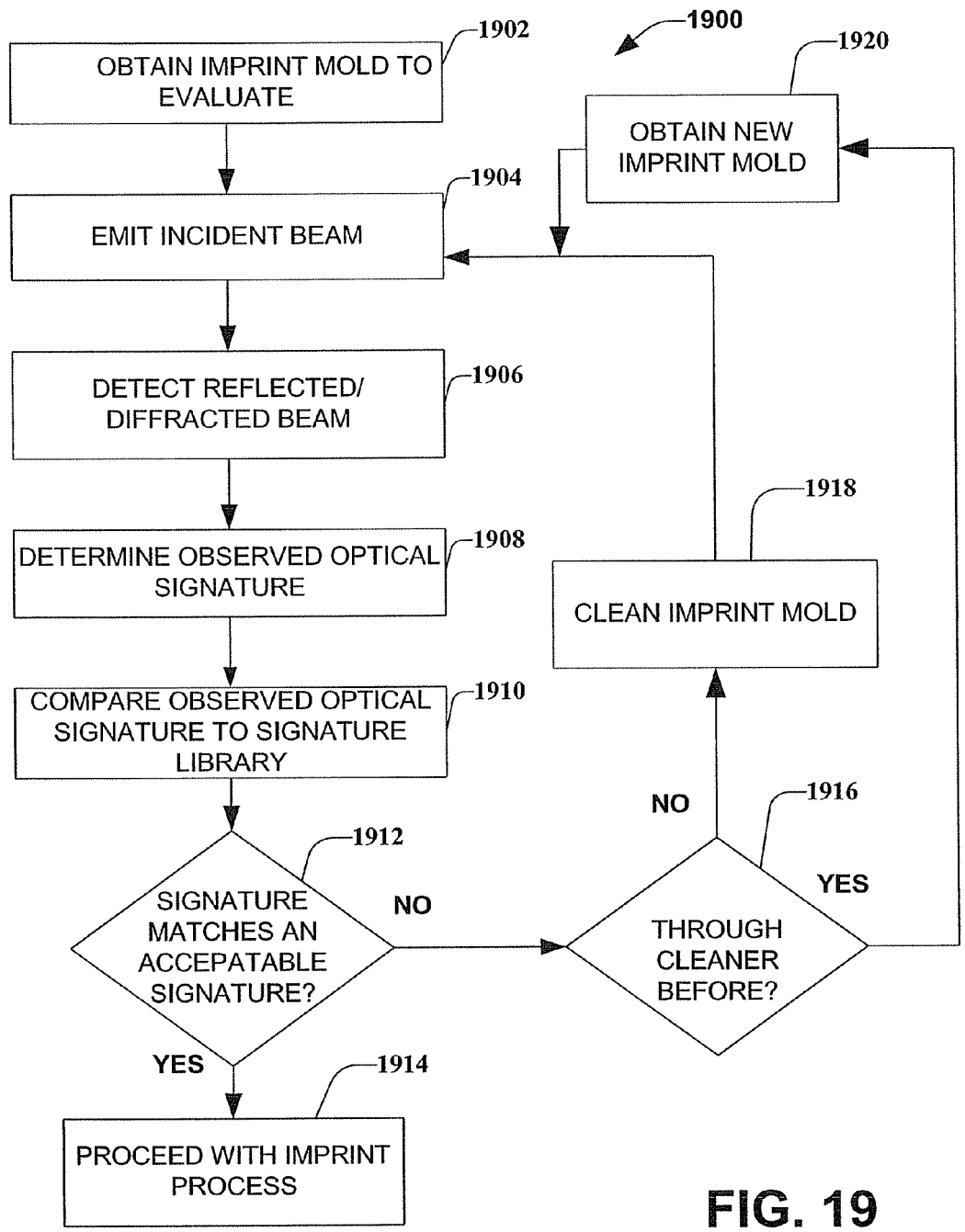
FIG. 19 illustrates a methodology used to evaluate the surface of an imprint mold for contamination or wear in accordance with an aspect of the present invention.

In view of the exemplary systems shown and described above, methodologies 1800 and 1900 which may be implemented in accordance with an aspect of the present invention will be better appreciated with reference to the flow diagrams illustrated in FIG. 18 and FIG. 19 respectively. While, for purposes of simplicity of explanation, methodologies 1800 and 1900 are shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware, a combination thereof, or any suitable means (e.g., device, system, process, component, etc.) for carrying out the functionality associated with the blocks. It is also to be appreciated that the blocks are merely to illustrate certain aspects of the present invention in a simplified form and that these aspects may be illustrated via a lesser and/or greater number of blocks.

FIG. 18 illustrates a methodology 1800 that uses scatterometry to evaluate the pattern transfer on the surface of a substrate in accordance with an aspect of the present invention. Although the illustrated methodology applies to an oxygen transfer etch that facilitates transfer of the via portion of a dual damascene pattern from an imaging layer to a transfer layer, it is to be appreciated that the methodology can be applied to evaluate the pattern transfer at any stage of a dual damascene imprint lithography process.

Prior to the start of methodology 1800, an imprint mold is utilized to make an imprint of a dual damascene pattern in an imaging layer. The imaging layer has been exposed to a light source which cured the imaging layer and a halogen breakthrough etch has been completed exposing portions of the transfer layer corresponding to the locations of the via portions of the dual damascene pattern.

Methodology 1800 begins at 1802 where a first oxygen transfer etch is performed to facilitate transfer of the via portions of the dual damascene pattern from the imaging layer to the transfer layer. After a prescribe amount of etching has been performed, an incident beam is emitted at 1804 from a light source component of a scatterometry component. The incident beam is directed at the surface of the substrate at a location under evaluation. At least a portion of the incident beam is reflected and/or diffracted from the surface of the substrate and is detected at 1806 by a detector component portion of the scatterometry component. At 1808, the scatterometry component determines an observed optical signature based at least in part on the characteristics of the reflected/diffracted beam from the location on the surface of the substrate.

At 1810, the observed optical signature is compared to a library of optical signatures. The library of signatures contains observed and/or simulated optical signatures corresponding to known conditions. The library includes a family of acceptable optical signatures corresponding to a range of acceptable values for the depth of penetration of vias and a family of unacceptable optical signatures corresponding to unacceptable values for the depth of penetration of the vias. Unacceptable optical signatures correspond to conditions where the depth of penetration of the vias is either too deep or to shallow into the transfer layer. At 1812 it is determined whether the observed optical signature matches any of the acceptable optical signatures. If the observed optical signature matches an acceptable optical signature, the methodology proceeds to 1814 where the process continues with the next step, a halogen etch in this example. However, if at 1812, it is determined that the optical signature does not match an acceptable optical signature, the methodology proceeds to 1816.

At 1816 the methodology determines whether the observed optical signature matches an unacceptable optical signature corresponding to the depth of penetration of the vias being too shallow. If the observed optical signature matches an optical signature from the family of signatures corresponding to the depth of penetration of the vias being to shallow, then the methodology returns to 1802 where the oxygen transfer etch is resumed to increase the depth of penetration of the pattern transfer. However, if at 1816 it is determined that observed optical signature matches an optical signature from the family of signatures corresponding to the depth of penetration of the vias being to deep, then the methodology proceeds to 1818 where the parameters of the etch process are altered to affect the subsequent etch processes such that the process will etch away less material. At 1820, the methodology proceeds to the next grid location on the substrate or to the next substrate if all locations of the given substrate have been completed.

The above illustration is for a particular oxygen transfer etch (i.e. an oxygen transfer etch to transfer the via portion of a dual damascene pattern from an imaging layer to a transfer layer). However, it is understood that the above methodology may be applied and adapted to not only oxygen transfer etches for vias, but also for trenches, other features, as well as other etch processes, such as for example, halogen breakthrough etches and dielectric etches.

In accordance another aspect of the present invention, scatterometry is used in a similar manner to evaluate the surface of an imprint mold for contamination or wear. Because imprint lithography brings the imprint mold into physical contact with the material comprising the imaging layer, the imprint mold is subject to contamination from residual material or other contaminants upon its imprint surface as well as physical wear over an extended period of use. FIG. 19 illustrates a methodology 1900 used to evaluate the surface of an imprint mold for contamination or wear. The evaluation by scatterometry may be made prior to an actual imprint operation or after completion of an imprint operation.

Methodology 1900 begins at 1902 by obtaining the imprint mold to be evaluated. At 1904 an incident beam is directed at the surface of the imprint mold at a location under evaluation. At least a portion of the incident beam is reflected and/or diffracted from the surface of the imprint mold and is detected at 1906 by a detector component portion of a scatterometry component. At 1908, the scatterometry component determines an observed beam optical signature based at least in part of the characteristics of the reflected/diffracted beam from the location under evaluation on the surface of the imprint mold.

At 1910, the observed optical signature is compared to a library of optical signatures. The library of optical signatures contains observed and/or simulated optical signatures corresponding to known conditions. The library includes a family of acceptable optical signatures corresponding to a substantially clean, unworn imprint surface. At 1912 it is determined whether the observed optical signature matches any of the acceptable optical signatures. If the observed optical signature matches an acceptable optical signature, then the surface of the imprint mold is substantially free from contaminants or wear which might create defects if this imprint mold were used to imprint a substrate. If the observed optical signature matches an acceptable optical signature, the methodology proceeds to 1914 where the process continues with the imprint process. However, if at 1912, it is determined that the optical signature does not match an acceptable optical signature, the methodology proceeds to 1916.

At 1916 the methodology determines whether the imprint mold has already been cleaned or not. If the imprint mold has not already been cleaned, then the methodology continues on to 1918 where a cleaning operation is performed on the imprint mold. After the cleaning operation is complete, the methodology returns to 1904 to begin another evaluation process. Returning to 1916, if it is determined at 1916 that the imprint mold has already been through the cleaning operation, then the methodology proceeds to 1920 where a new imprint mold is obtained for evaluation. Once a new imprint mold is obtained, the methodology returns to and proceeds from 1904.

While for purposes of illustration, the illustrated methodology determines whether the cleaning operation has been already been performed one time, it is understood that the methodology can be used determine whether any specified number of cleaning operations has been performed. For example, perhaps the imprint mold might need to have up to five cleaning operations to remove certain contaminants. In this case, the methodology would allow a given imprint mold to cycle through the methodology for 5 cleaning operations and would not obtain a new imprint mold until the observed optical signature was unsatisfactory for a sixth time.

What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for facilitating dual damascene interconnect integration in one imprint act, comprising:
   a translucent imprint mold comprising a dual damascene pattern, wherein the dual damascene pattern has a pattern for at least one groove and at least one conductive via opening;
   a coated substrate;
   an imprint process component;
   an etch process component; and
   a metal fill process component.

2. The system of claim 1 further comprising a scatterometry component comprising:
   one or more optical light sources;
   one or more optical detectors; and
   a control component comprising a processor and a memory.

3. The system of claim 2, the scatterometry component further comprising at least one of a data store component and an artificial intelligence component.

4. The system of claim 1, the coated substrate comprising an underlying substrate, a dielectric layer, and a transfer layer.

5. The system of claim 4, the dielectric layer comprising at least one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly(arylene ester), parylene F, parylene N and amorphous polytetrafluoroethylene.

6. The system of claim 4 further comprising an imaging layer deposited upon the transfer layer, the imaging layer comprising a low viscosity, photopolymerizable, organosilicon material.

7. The system of claim 4, wherein the transfer layer comprises a photoresist material.

8. A system for facilitating dual damascene interconnect integration in one imprint act, comprising:
   a translucent imprint mold comprising a dual damascene pattern, wherein the dual damascene pattern has a pattern for at least one groove and at least one conductive via opening;
   a coated substrate comprising an imaging layer formed thereover;
   an imprint process component;
   an etch process component; and
   a metal fill process component.

9. The system of claim 8 further comprising a scatterometry component comprising:
   one or more optical light sources;
   one or more optical detectors; and
   a control component comprising a processor and a memory.

10. The system of claim 9, the scatterometry component further comprising at least one of a data store component and an artificial intelligence component.

11. The system of claim 8, the coated substrate comprising an underlying substrate, a dielectric layer, and a transfer layer.

12. The system of claim 11, the dielectric layer comprising at least one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly(arylene ester), parylene F, parylene N and amorphous polytetrafluoroethylene; and the transfer layer comprising a photoresist material.

13. The system of claim 11, the imaging layer comprising a low viscosity, photopolymerizable, organosilicon material.

14. A system for facilitating dual damascene interconnect integration in one imprint act, comprising:
   a translucent imprint mold comprising a dual damascene pattern, wherein the dual damascene pattern has a pattern for at lest one groove and at least one conductive via opening;
   a coated substrate;
   an imprint process component;
   an etch process component;
   a metal fill process component; and
   a scatterometry component comprising:
   one or more optical light sources;
   one or more optical detectors; and
   a control component comprising a processor and a memory.

15. The system of claim 14, the scatterometry component further comprising at least one of a data store component and an artificial intelligence component.

16. The system of claim 14, the coated substrate comprising an underlying substrate, a dielectric layer, and a transfer layer.

17. The system of claim 16, the dielectric layer comprising at least one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly(arylene ester), parylene F, parylene N and amorphous polytetrafluoroethylene.

18. The system of claim 16 further comprising an imaging layer deposited upon the transfer layer, the imaging layer comprising a low viscosity, photopolymerizable, organosilicon material.

19. The system of claim 16, the transfer layer comprising a photoresist material.

20. The system of claim 16, the dielectric layer comprising silicon dioxide.

* * * * *